United States Patent
Ko

(10) Patent No.: US 9,368,229 B2
(45) Date of Patent: Jun. 14, 2016

(54) SEMICONDUCTOR INTEGRATED CIRCUIT DEVICE INCLUDING FUSE BLOCK

(71) Applicant: SK hynix Inc., Icheon-si Gyeonggi-do (KR)

(72) Inventor: Keun Sik Ko, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 14/564,904

(22) Filed: Dec. 9, 2014

(65) Prior Publication Data

US 2016/0071613 A1    Mar. 10, 2016

(30) Foreign Application Priority Data

Sep. 4, 2014  (KR) .................... 10-2014-0117681

(51) Int. Cl.

| | |
|---|---|
| *G11C 17/16* | (2006.01) |
| *G11C 17/18* | (2006.01) |
| *G11C 29/00* | (2006.01) |
| *G11C 7/00* | (2006.01) |
| *G11C 29/04* | (2006.01) |
| G11C 29/44 | (2006.01) |

(52) U.S. Cl.
CPC ................ *G11C 17/18* (2013.01); *G11C 17/16* (2013.01); *G11C 29/78* (2013.01); *G11C 29/785* (2013.01); *G11C 2029/4402* (2013.01)

(58) Field of Classification Search
CPC ................ G11C 17/19; G11C 29/785; G11C 2029/4402
USPC ............. 365/200, 225.7, 230.03, 230.08, 203
See application file for complete search history.

(56) References Cited

U.S. PATENT DOCUMENTS

| | | | | |
|---|---|---|---|---|
| 5,740,114 | A * | 4/1998 | Hirano ................... | G11C 29/24 365/200 |
| 5,740,120 | A * | 4/1998 | Okamura ............... | G11C 5/025 365/189.05 |
| 5,953,264 | A * | 9/1999 | Hirano ................... | G11C 29/24 365/200 |
| 7,495,310 | B2 * | 2/2009 | Douzaka ................ | G11C 17/18 257/529 |
| 2003/0086326 | A1 * | 5/2003 | Tran .................... | G11C 16/0441 365/225.7 |
| 2004/0218433 | A1 * | 11/2004 | Kang ................... | G11C 29/842 365/200 |
| 2010/0290299 | A1 * | 11/2010 | Matsumoto ........... | G11C 29/88 365/200 |
| 2011/0069568 | A1 | 3/2011 | Shin et al. | |
| 2011/0235453 | A1 * | 9/2011 | Chi ..................... | G11C 29/785 365/225.7 |
| 2014/0064003 | A1 * | 3/2014 | Kang ................... | G11C 29/785 365/203 |

FOREIGN PATENT DOCUMENTS

KR    1020120086074 A    8/2012

* cited by examiner

*Primary Examiner* — Ly D Pham

(74) *Attorney, Agent, or Firm* — William Park & Associates Ltd.

(57) ABSTRACT

A semiconductor integrated circuit device includes a plurality of column repair address lines configured to cross and a plurality of mat select lines; a fuse set unit including a plurality of latch units electrically coupled with the plurality of column repair address lines and the plurality of mat select lines; a fuse driving unit configured to provide fuse data to the latch units through the plurality of column repair address lines; and an equalizer configured to equalize the fuse data to a same level in response to a select signal of the fuse set unit and a boot-up signal of the fuse set unit.

20 Claims, 5 Drawing Sheets

SEMICONDUCTOR INTEGRATED CIRCUIT DEVICE INCLUDING FUSE BLOCK

CROSS-REFERENCES TO RELATED APPLICATION

The present application claims priority under 35 U.S.C. §119(a) to Korean application number 10-2014-0117681, filed on Sep. 4, 2014, in the Korean Intellectual Property Office, which is incorporated herein by reference in its entirety.

BACKGROUND

1. Technical Field

Various embodiments generally relate to a semiconductor integrated circuit device, and more particularly, to a semiconductor integrated circuit device including a fuse block.

2. Related Art

A redundancy block, that is, a fuse block is a block for replacing failed cells with redundant normal cells. In the case of a semiconductor memory device, a redundancy block may be disposed for each of a row-related line (for example, a word line) and a column-related line (for example, a bit line), and may include a fuse block for generating and storing the address information of failed cells.

A fuse block may include a plurality of fuse set circuit units and a plurality of fuse lines. The fuse set circuit units may input and output data information according to whether the fuse lines are cut or not. For example, because a plurality of fuse set circuit units are electrically coupled to one row select signal line (a mat select signal line), remaining fuse set circuit units except a selected fuse set circuit unit become a floating state. The floated fuse set circuit units may serve as leakage sources or may change output data values when the data of redundancy cells are outputted.

SUMMARY

A semiconductor integrated circuit device configured to provide equalized fuse data to a plurality of storages of a fuse set unit electrically coupled with a selected mat select signal line and unselected column repair address lines.

In an embodiment, a semiconductor integrated circuit device may include a plurality of column repair address lines configured to cross a plurality of mat select lines. The semiconductor integrated circuit device may also include a fuse set unit including a plurality of latch units electrically coupled with the plurality of column repair address lines and the plurality of mat select lines. The semiconductor integrated circuit device may also include a fuse driving unit configured to provide fuse data to the latch units through the plurality of column repair address lines. In addition, semiconductor integrated circuit device may also include an equalizer configured to equalize the fuse data to a same level in response to a select signal of the fuse set unit and a boot-up signal of the fuse set unit.

In an embodiment, a semiconductor integrated circuit device may include a pair of banks including pluralities of mats arranged in row and column directions. The semiconductor integrated circuit device may also include a fuse block disposed between and shared by the pair of banks. The fuse block may include: a fuse set circuit block including a plurality of fuse set units; a fuse driving block configured to provide fuse data to the fuse set circuit block; and an equalizer configured to equalize the fuse data when a fuse set unit is not selected but booted up.

DETAILED DESCRIPTION

Hereinafter, a semiconductor integrated circuit device including a fuse block will be described below with reference to the accompanying figures through various embodiments.

Figure 1:
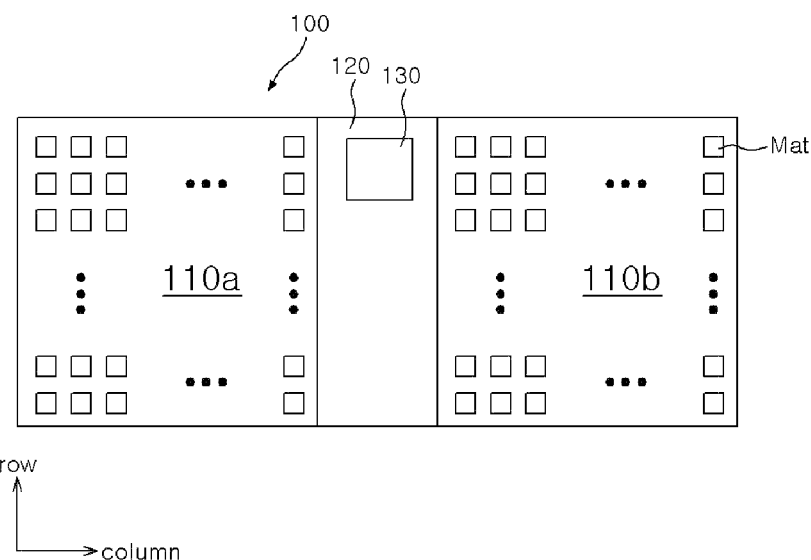
FIG. 1 is a schematic plan view illustrating a representation of an example of a semiconductor chip in accordance with an embodiment.

Referring to FIG. 1, a semiconductor chip 100 may include a plurality of banks. A pair of banks 110a and 110b among the plurality of banks, which are adjacent to each other in the column direction, may share a fuse block 130. The fuse block 130 may be disposed in a peripheral circuit region 120 defined between the pair of banks 110a and 110b. Each of the banks 110a and 110b may include a plurality of mats, that is, a plurality of memory cell array regions. Further, each mat may include a plurality of memory cells.

Figure 2:
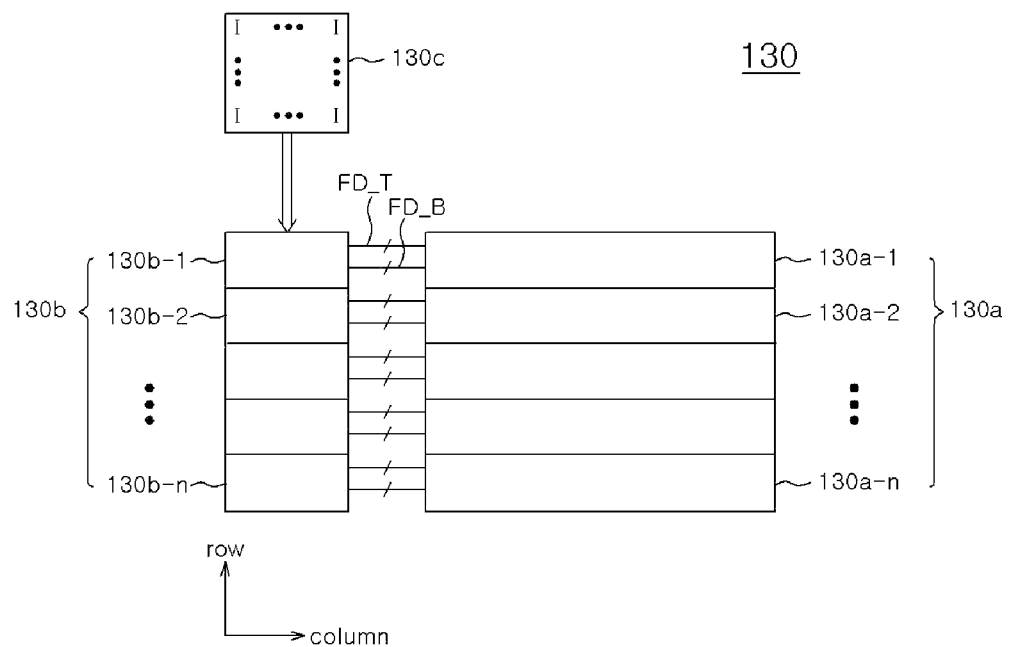
FIG. 2 is a schematic plan view illustrating a representation of an example of a fuse block in accordance with an embodiment.

Referring to FIG. 2, the fuse block 130 may include a fuse set circuit block 130a, a fuse driving block 130b, and a plurality of fuse lines 130c. The plurality of fuse lines 130c are electrically coupled with the fuse driving block 130b, and provide the data information determined according to whether they are cut or not, to the fuse driving block 130b. More specifically, in a case where a fail occurs among memory cells in a mat, data to be stored in a failed memory cell may be stored in a specified fuse line 130c. The storage of the data may be performed by a process such as fuse blowing, rupture, cutting, and so forth. The fuse driving block 130b electrically coupled with the fuse lines 130c is inputted with the data information according to whether the fuse lines 130c are cut or not. In addition, the fuse driving block 130b drives and provides the data information to the fuse set circuit block 130a.

The fuse set circuit block 130a may include a plurality of fuse set units 130a-1 to 130a-n. The fuse driving block 130b may include a plurality of fuse driving units 130b-1 to 130b-n.

The plurality of fuse set units 130a-1 to 130a-n may be configured to respectively correspond to the fuse driving units 130b-1 to 130b-n.

Figure 3:
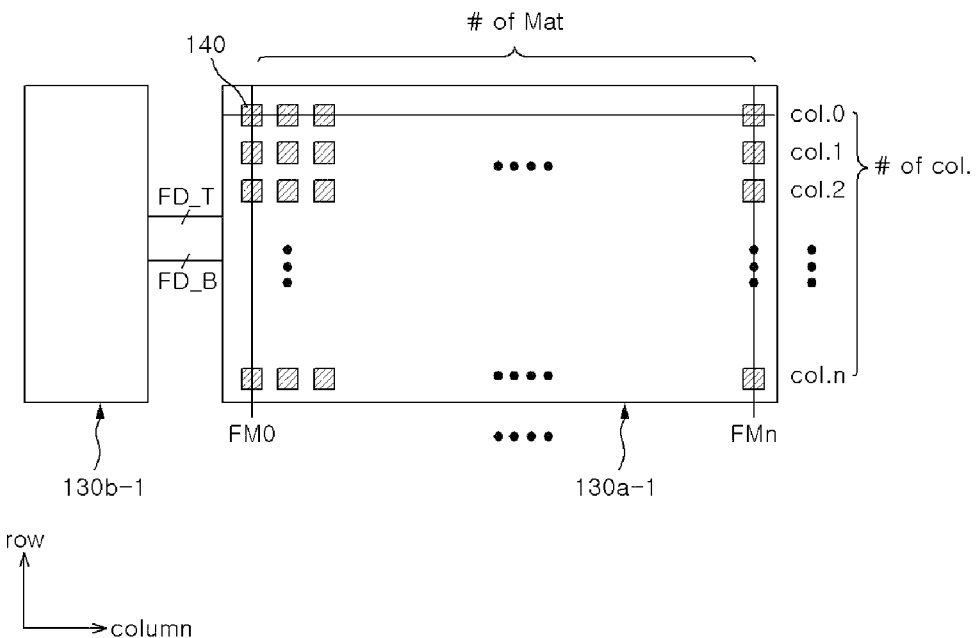
FIG. 3 is a detailed plan view illustrating a representation of an example of a fuse set circuit block and a fuse driving block in accordance with an embodiment.

The plurality of respective fuse set units 130a-1 to 130a-n may have the same configuration. The fuse set unit 130a-1 randomly selected among the plurality of fuse set units 130a-1 to 130a-n may include a plurality of CCL (cross-coupled latch) units 140, as shown in FIG. 3. Referring to FIG. 3, the plurality of CCL units 140 which are disposed in one fuse set unit 130a-1 may be arranged in a matrix type, for example, in such a manner that pluralities of CCL units 140 are disposed in the column direction and the row direction.

In each of the fuse set units 130a-1 to 130a-n, a plurality of, for example, 8 column repair address lines col.0 to col.n may extend in the column direction. Further, a plurality of mat select signal lines FM0 to FMn, the number of which corresponds to, for example, the number of entire mats electrically coupled to one column address line (not shown) of each of the banks 110a and 110b, may extend in the row direction.

For example, the CCL units 140 may be disposed at the crossing points of the column repair address lines col.0 to col.n and the mat select signal lines FM0 to FMn.

Figure 4:
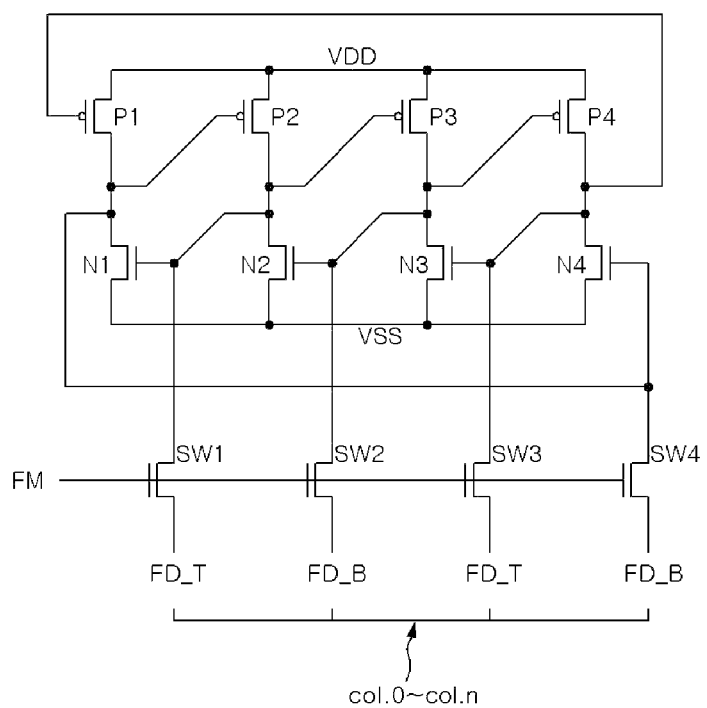
FIG. 4 is a detailed circuit diagram illustrating a representation of an example of a CCL (cross-coupled latch) unit in accordance with an embodiment.

The CCL unit 140 may be a latch circuit unit for temporarily storing fuse data. In other words, referring to FIG. 4, the CCL unit 140 may include first to fourth switching elements SW1 to SW4, first to fourth PMOS transistors P1 to P4, and first to fourth NMOS transistors N1 to N4.

The first to fourth switching elements SW1 to SW4 are driven to switch and output the fuse data provided from the fuse driving block 130b in response to a mat select signal FM. The first to fourth switching elements SW1 to SW4 may be, for example, NMOS transistors.

The first to fourth PMOS transistors P1 to P4 and the first to fourth NMOS transistors N1 to N4 may be electrically coupled, for example, in a cross-coupled type. The first to fourth PMOS transistors P1 to P4 and the first to fourth NMOS transistors N1 to N4 may temporarily store fuse data signals FD1_T, FD_B, FD_T and FD1_B transferred from the first to fourth switching elements SW1 to SW4.

For example, the first to fourth PMOS transistors P1 to P4 are configured in such a manner that the sources thereof are electrically coupled to a power supply voltage VDD and the drains thereof are respectively electrically coupled to the drains of the first to fourth NMOS transistors N1 to N4. The gate of the first PMOS transistor P1 is electrically coupled with the drain of the fourth PMOS transistor P4. In addition, the gate of the second PMOS transistor P2 is electrically coupled with the drain of the first PMOS transistor P1. Further, the gate of the third PMOS transistor P3 is electrically coupled with the drain of the second PMOS transistor P2. In addition, the gate of the fourth PMOS transistor P4 is electrically coupled with the drain of the third PMOS transistor P3.

The first to fourth NMOS transistors N1 to N4 are configured in such a manner that the sources thereof are electrically coupled to a ground voltage VSS and the drains thereof are respectively electrically coupled to the drains of the first to fourth PMOS transistors P1 to P4. The gate of the first NMOS transistor N1 is electrically coupled with the drain of the second NMOS transistor N2. Further, the gate of the second NMOS transistor N2 is electrically coupled with the drain of the third NMOS transistor N3. In addition, the gate of the third NMOS transistor N3 is electrically coupled with the drain of the fourth NMOS transistor N4. Further, the gate of the fourth NMOS transistor N4 is electrically coupled with the drain of the first NMOS transistor N1.

The CCL unit 140 configured in this way may temporarily store and output the fuse data inputted thereto by performing general latch driving.

Referring again to FIG. 3, in the case where any one of the mat select signal lines FM0 to FMn is enabled, the plurality of CCL units 140 electrically coupled to the enabled mat select signal line FM0 to FMn may be in an enabled state. Among the plurality of CCL units 140, the CCL unit 140, to which the fuse data signals FD_T and FD_B are inputted through the column repair address line col.0 to col.n, performs a latch operation, but the remaining CCL units 140 may be in a floated state. As a result, as aforementioned above, a large amount of leakage current may be produced in the fuse set circuit block 130a, and already stored data may be lost.

Accordingly, in an embodiment, equalized fuse data may be provided to the CCL units 140 electrically coupled with the selected mat select signal line FM0 to FMn and the unselected column repair address lines col.0 to col.n.

Figure 5:
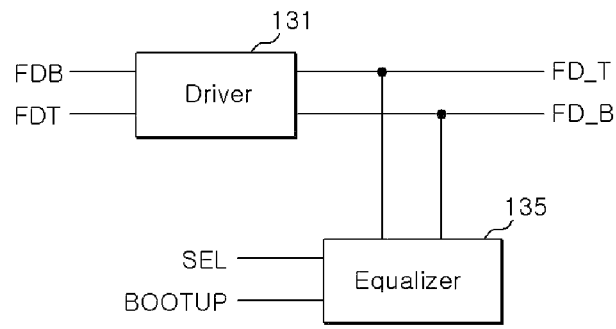
FIG. 5 is a schematic block diagram illustrating a representation of an example of a fuse driving unit in accordance with an embodiment.
Figure 6:
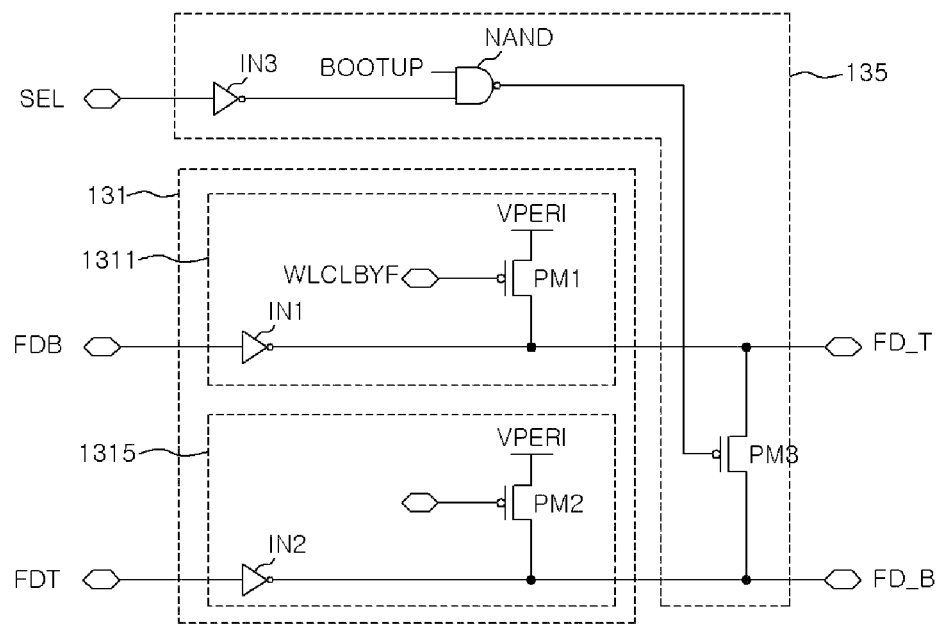
FIG. 6 is a detailed circuit diagram illustrating a representation of an example of the fuse driving unit in accordance with an embodiment.

Referring to FIGS. 5 and 6, the fuse driving block 130b may include a driver 131 and an equalizer 135.

The driver 131 is inputted with a pair of pre-fuse data signals FDB and FDT which reflect the state of the fuse line 130c. Further the driver 131 is configured to drive the pair of pre-fuse data signals FDB and FDT with a predetermined voltage, for example, a peripheral voltage VPERI. In addition, the driver 131 may output the fuse data signals FD_T and FD_B. The driver 131 may include a first data signal generating section 1311 which generates fuse data of a true level. The driver 131 may also include a second data signal generating section 1315 which generates fuse data of a bar level.

The first data signal generating section 1311 may include a first inverter IN1 and a first output transistor PM1. The first inverter IN1 is inputted with and inverts the first pre-fuse data signal FDB. The first output transistor PM1 is electrically coupled to the output terminal of the first inverter IN1. The first output transistor PM1 outputs the peripheral voltage VPERI as the first fuse data signal FD_T in response to a precharge signal WLCLBYF.

The second data signal generating section 1315 may include a second inverter IN2 and a second output transistor PM2. The second inverter IN2 is inputted with and inverts the second pre-fuse data signal FDT which has a level opposite to the first pre-fuse data signal FDB. The second output transistor PM2 is electrically coupled to the output terminal of the second inverter IN2. The second output transistor PM2 outputs the peripheral voltage VPERI as the second fuse data signal FD_B in response to the precharge signal WLCLBYF.

The equalizer 135 includes a third inverter IN3, a NAND gate NAND, and a PMOS transistor PM3. A select signal (hereinafter, referred to as a fuse set select signal) SEL of the fuse set units 130a-1 to 130a-n is inputted to the third inverter IN3. In addition, the output signal of the third inverter IN3, that is, the inverted signal of the fuse set select signal SEL, and a boot-up signal BOOTUP are inputted to the NAND gate NAND. The boot-up signal BOOTUP is a signal for sequentially driving the fuse set units 130a-1 to 130a-n of the fuse set circuit block 130a. The PMOS transistor PM3 equalizes the first fuse data signal FD_T and the second fuse data signal FD_B in response to the output signal of the NAND gate NAND. More specifically, the NAND gate NAND may provide an enable signal for driving the equalizing transistor PM3 in the case where the fuse set units 130a-1 to 130a-n are not selected but are booted up. In other words, the boot-up of the fuse set units 130a-1-130a-n may correspond to a condition by which the mat select signal line FM0 to FMn is enabled. Further, a condition by which the fuse set select signal SEL is not selected may correspond to a condition by which fuse data are not loaded on the column repair address lines col.0 to col.n.

Accordingly, the fuse driving units 130b-1 to 130b-n output the fuse data FD_T and FD_B having the same levels, when the fuse set units 130a-1 to 130a-n are not selected and the boot-up signal BOOTUP is enabled. Therefore, the fuse data FD_T and FD_B may be applied to corresponding CCL units 140 through the column repair address lines col.0 to col.n, by which it is possible to reduce leakage current and decrease data loss due to floating.

In the case where the fuse set units 130a-1 to 130a-n are selected, since the PMOS transistor PM3 of the equalizer 135 is not driven, the equalizer 135 outputs normal fuse data FD_T and FD_B.

Figure 7:
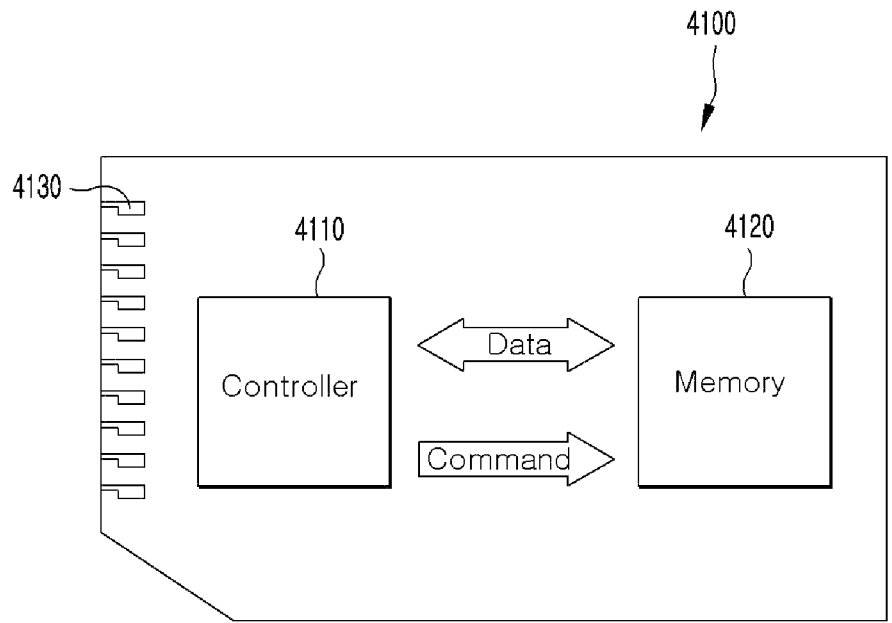
FIG. 7 is a schematic diagram illustrating a representation of an example of a memory card in accordance with an embodiment.

Referring to FIG. 7, a schematic diagram illustrating a representation of an example of a memory card with a semiconductor device in accordance with the various embodiments of the invention is shown.

A memory card system 4100 including a controller 4110, a memory 4120 and an interface member 4130 may be provided. The controller 4110 and the memory 4120 may be configured to exchange a command and/or data. For example, the memory 4120 may be used in storing a command to be executed by the controller 4110 and/or user data.

The memory card system 4100 may store data in the memory 4120 or output data from the memory 4120 to an external device. The memory 4120 may include a semiconductor device according to any of the above-described embodiments.

The interface member 4130 may take charge in the input and output of data from and to the external device. The memory card system 4100 may be a multimedia card (MMC), a secure digital card (SD) or a portable data storage device or the like.

Figure 8:
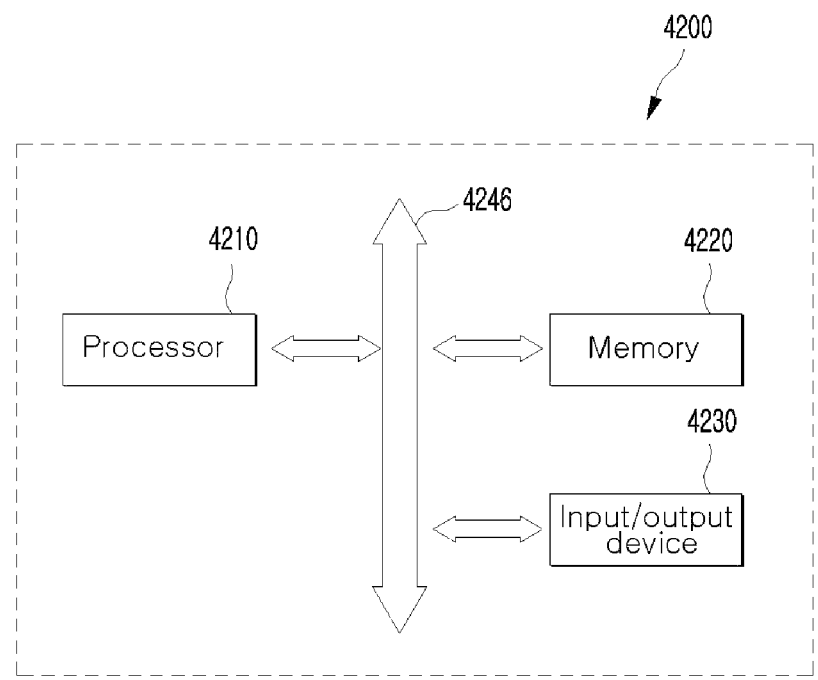
FIG. 8 is a block diagram illustrating a representation of an example of an electronic device in accordance with an embodiment.

Referring to FIG. 8, a block diagram illustrating a representation of an example of an electronic device with a semiconductor device in accordance with the various embodiments is shown.

An electronic device 4200 including a processor 4210, a memory 4220 and an input/output device 4230 may be provided. The processor 4210, the memory 4220 and the input/output device 4230 may be electrically coupled through a bus 4246.

The memory 4220 may receive a control signal from the processor 4210. The memory 4220 may store a code and data for the operation of the processor 4210. The memory 4220 may be used to store data to be accessed through the bus 4246.

The memory 4220 may include a semiconductor device according to any of the above-described embodiments. In order for detailed realization and modification, additional circuits and control signals may be provided.

The electronic device 4200 may configure various electronic control devices which need the memory 4220. For example, the electronic device 4200 may be used in a computer system, a wireless communication device, for example, a PDA, a laptop computer, a notebook computer, a web tablet, a wireless phone, a portable phone, a digital music player, an MP3 player, a navigator, a solid state disk (SSD), a household appliance, or a device capable of transmitting and receiving information under wireless circumstances.

Descriptions will be made below for the detailed realization and modification examples of the electronic device 4200 with reference to FIGS. 9 and 10.

Figure 9:
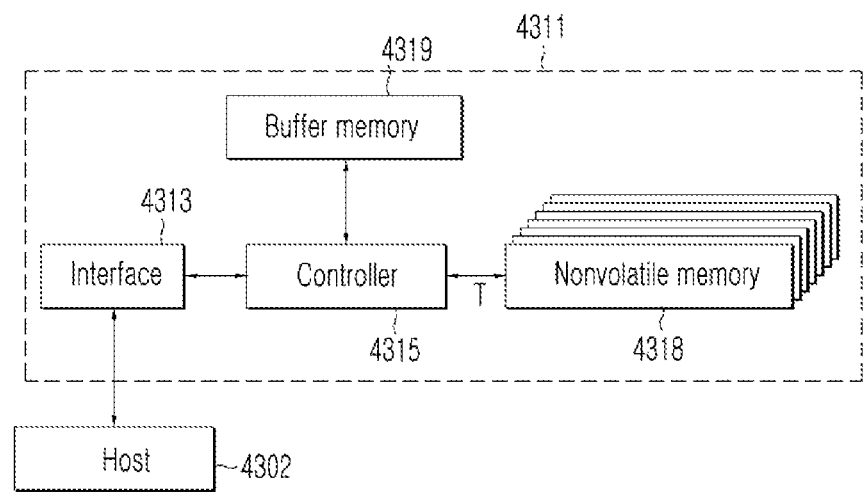
FIG. 9 is a block diagram illustrating a representation of an example of a data storage device in accordance with an embodiment.

Referring to FIG. 9, a block diagram illustrating a representation of an example of a data storage device with a semiconductor device in accordance with the various embodiments of the invention is shown.

A data storage device such as a solid state disk (SSD) 4311 may be provided. The solid state disk 4311 may include an interface 4313, a controller 4315, a nonvolatile memory 4318, and a buffer memory 4319.

The solid state disk 4311 is a device which stores information by using a semiconductor device. The solid state disk 4311 provides advantages in that a speed is high, a mechanical delay, a failure rate, heat generation and noise generation decrease, and miniaturization and light weight may be accomplished, when compared to a hard disk drive (HDD). The solid state disk 4311 may be widely used in a notebook PC, a net book, a desktop PC, an MP3 player, or a portable storage device or the like.

The controller 4315 may be formed adjacent to the interface 4313 and may be electrically coupled to the interface 4313. The controller 4315 may be a microprocessor including a memory controller and a buffer controller. The nonvolatile memory 4318 may be formed adjacent to the controller 4315 and may be electrically coupled to the controller 4315 via a connection terminal T. The data storage capacity of the solid state disk 4311 may correspond to the nonvolatile memory 4318. The buffer memory 4319 may be formed adjacent to the controller 4315 and may be electrically coupled to the controller 4315.

The interface 4313 may be electrically coupled to a host 4302. In addition, the interface 4313 may play the role of transmitting and receiving electrical signals such as data. For example, the interface 4313 may be a device which uses the same standard as SATA, IDE, SCSI, and/or combination thereof. The nonvolatile memory 4318 may be electrically coupled to the interface 4313 via the controller 4315.

The nonvolatile memory 4318 may play the role of storing the data received through the interface 4313.

The nonvolatile memory 4318 may include a semiconductor device according to any of the above-described embodiments. The nonvolatile memory 4318 has a characteristic that the data stored are retained even though power supply to the solid state disk 4311 is interrupted.

The buffer memory 4319 may include a volatile memory. The volatile memory may be a DRAM and/or an SRAM. The buffer memory 4319 has a relatively high operation speed in comparison to the nonvolatile memory 4318.

The data processing speed of the interface 4313 may be relatively faster as compared to the operation speed of the nonvolatile memory 4318. The buffer memory 4319 may play the role of temporarily storing data. The data received through the interface 4313 may be temporarily stored in the buffer memory 4319 via the controller 4315. Further, the data received through the interface 4313 then, may be permanently stored in the nonvolatile memory 4318 in conformity with the data recording speed of the nonvolatile memory 4318.

The data frequently used among the data stored in the nonvolatile memory 4318 may be read in advance and may be temporarily stored in the buffer memory 4319. Namely, the buffer memory 4319 may play the role of increasing the effective operation speed of the solid state disk 4311 and decreasing an error occurrence rate.

Figure 10:
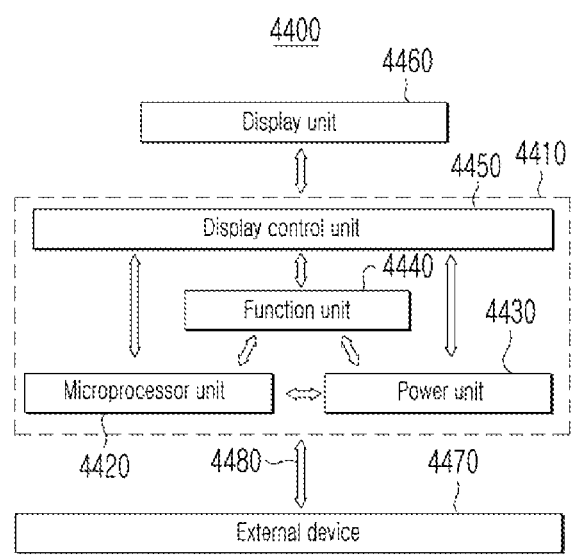
FIG. 10 is a block diagram illustrating a representation of an example of an electronic system in accordance with an embodiment.

Referring to FIG. 10, a block diagram illustrating a representation of an example of an electronic system with a semiconductor device in accordance with the various embodiments is shown.

An electronic system 4400 including a body 4410, a microprocessor unit 4420, a power unit 4430, a function unit 4440 and a display control unit 4450 may be provided.

The body 4410 may be a mother board formed by a printed circuit board. The microprocessor unit 4420, the power unit 4430, the function unit 4440 and the display controller unit 4450 may be mounted to the body 4410. A display unit 4460 may be disposed inside the body 4410 or outside the body 4410. For example, the display unit 4460 may be disposed on the surface of the body 4410. The display unit 4460 may display the image processed by the display controller unit 4450.

The power unit 4430 may play the role of receiving a voltage from an external battery or the like. The power unit 4430 may divide the voltage into desired voltage levels, and supply divided voltages to the microprocessor unit 4420, the function unit 4440, the display controller unit 4450, and so forth. The microprocessor unit 4420 may receive a voltage from the power unit 4430 and may control the function unit 4440 and the display unit 4460. The function unit 4440 may perform the various functions of the electronic system 4400. For example, in the case where the electronic system 4400 is a portable phone, the function unit 4440 may include various component elements capable of performing the functions of a portable phone such as dialing, image outputting to the display unit 4460 through communication with an external device 4470, voice outputting to a speaker, and so forth. When a camera is mounted together, the function unit 4440 may also play the role of a camera image processor.

When the electronic system 4400 is electrically coupled with a memory card or the like to increase capacity, the function unit 4440 may be a memory card controller. The function unit 4440 may exchange signals with the external device 4470 through a wired or wireless communication unit 4480. When the electronic system 4400 needs a USB or the like to expand functionality, the function unit 4440 may play the role of an interface controller. Any one semiconductor device among the semiconductor devices in accordance with the above-described embodiments may be applied to at least any one of the microprocessor unit 4420 and the function unit 4440.

While various embodiments have been described above, it will be understood to those skilled in the art that the embodiments described are by way of example only. Accordingly, the semiconductor integrated circuit device including a fuse block described herein should not be limited based on the described embodiments.

What is claimed is:

1. A semiconductor integrated circuit device configured to provide equalized fuse data to a plurality of storages of a fuse set unit electrically coupled with a selected mat select signal line and unselected column repair address lines,
    wherein the semiconductor integrated device includes an equalizer configured to equalize the fuse data to a same level in response to a select signal of the fuse set unit and a boot-up signal of the fuse set unit.

2. The semiconductor integrated circuit device according to claim 1,
    wherein the fuse data are provided from a fuse driving unit, and
    wherein the fuse driving unit comprises an equalizer configured to change the fuse data to have a same voltage level.

3. The semiconductor integrated circuit device according to claim 2, wherein the fuse driving unit comprises:
    a driver configured to drive pre-fuse data provided from fuse lines, and output the fuse data
    wherein the equalizer is included in the fuse driving unit.

4. The semiconductor integrated circuit device according to claim 1, wherein the equalizer comprises:
    a logic circuit section configured to output an enable signal when the fuse set unit is not selected and the boot-up signal is enabled; and
    a transistor configured to equalize signal lines to transfer the fuse data in response to the enable signal.

5. A semiconductor integrated circuit device comprising:
    a plurality of column repair address lines configured to cross a plurality of mat select lines;
    a fuse set unit including a plurality of latch units electrically coupled with the plurality of column repair address lines and the plurality of mat select lines;
    a fuse driving unit configured to provide fuse data to the latch units through the plurality of column repair address lines; and
    an equalizer configured to equalize the fuse data to a same level in response to a select signal of the fuse set unit and a boot-up signal of the fuse set unit.

6. The semiconductor integrated circuit device according to claim 5, wherein the equalizer comprises:
    a logic circuit section configured to output an enable signal when the fuse set unit is not selected and the boot-up signal is enabled; and
    a transistor configured to equalize signal lines to transfer the fuse data in response to the enable signal.

7. The semiconductor integrated circuit device according to claim 5, wherein the fuse driving unit is configured to correspond to the fuse set unit.

8. The semiconductor integrated circuit device according to claim 5, wherein the equalizer is configured between lines of the fuse driving unit which transfer the fuse data.

9. A semiconductor integrated circuit device comprising:
    a pair of banks including pluralities of mats arranged in row and column directions; and
    a fuse block disposed between and shared by the pair of banks,
    the fuse block comprising:
    a fuse set circuit block including a plurality of fuse set units;
    a fuse driving block configured to provide fuse data to the fuse set circuit block; and
    an equalizer configured to equalize the fuse data when a fuse set unit is not selected but booted up.

10. The semiconductor integrated circuit device according to claim 9,
    wherein the fuse set circuit block includes a plurality of fuse set units, and
    wherein each fuse set unit comprises:
    a plurality of column repair address lines crossing a plurality of mat select lines; and
    a plurality of latch units electrically coupled with the plurality of column repair address lines and the plurality of mat select lines.

11. The semiconductor integrated circuit device according to claim 10, wherein the latch units are arranged in the row direction by a number corresponding to the number of the column repair address lines, and arranged in the column direction by an other number corresponding to the number of mats arranged in the column direction in each bank.

12. The semiconductor integrated circuit device according to claim 10, wherein the fuse driving block comprises a plurality of fuse driving units configured to provide the fuse data in correspondence to the respective fuse set units.

13. The semiconductor integrated circuit device according to claim 12, wherein each of the fuse driving units comprises:
    a first data signal generating section configured to receive first pre-fuse data from a fuse line, and drive the first pre-fuse data; and a second data signal generating section configured to receive second pre-fuse data with a level opposite to the first pre-fuse data from the fuse line, and drive the second pre-fuse data.

14. The semiconductor integrated circuit device according to claim 9, wherein the equalizer is configured in each fuse driving unit.

15. The semiconductor integrated circuit device according to claim 14, wherein the equalizer is configured to equalize the fuse data to a same level in response to a select signal of the fuse set unit and a boot-up signal of the fuse set unit.

16. The semiconductor integrated circuit device according to claim 15, wherein the equalizer comprises:
a logic circuit section configured to output an enable signal when the fuse set unit is not selected and the boot-up signal is enabled; and
a transistor configured to equalize signal lines to transfer the fuse data in response to the enable signal.

17. The semiconductor integrated circuit device according to claim 13,
wherein the first data signal generating section is configured to generate the fuse data of a first level, and
wherein the second data signal generating section is configured to generate the fuse data of a second level.

18. The semiconductor integrated circuit device according to claim 11, wherein the fuse data is applied to the latch units through the number of column repair address lines.

19. The semiconductor integrated circuit device according to claim 13,
wherein the first data signal generating section outputs a peripheral voltage as a first fuse data signal according to a precharge signal, and
wherein the second data signal generating section outputs the peripheral voltage as a second fuse data signal according to the precharge signal.

20. The semiconductor integrated circuit device according to claim 16, wherein the transistor is configured to equalize a first fuse data signal and a second fuse data signal according to the enable signal of the logic circuit section.

* * * * *